United States Patent
Tanaka et al.

(10) Patent No.: US 9,083,301 B2
(45) Date of Patent: Jul. 14, 2015

(54) BALANCE FILTER

(71) Applicant: Murata Manufacturing Co., Ltd., Nagaokakyo-shi, Kyoto-fu (JP)

(72) Inventors: Akira Tanaka, Nagaokakyo (JP); Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 246 days.

(21) Appl. No.: 13/857,165

(22) Filed: Apr. 5, 2013

(65) Prior Publication Data

US 2013/0307643 A1 Nov. 21, 2013

(30) Foreign Application Priority Data

May 17, 2012 (JP) .................................. 2012-112930

(51) Int. Cl.
*H03H 7/42* (2006.01)
*H03H 7/01* (2006.01)

(52) U.S. Cl.
CPC ............... *H03H 7/0115* (2013.01); *H03H 7/42* (2013.01)

(58) Field of Classification Search
CPC .................................................... H03H 7/0115
USPC ....................... 333/185, 25–26, 204, 175–177
See application file for complete search history.

(56) References Cited

U.S. PATENT DOCUMENTS

| 7,034,630 | B2 * | 4/2006 | Rijks ................................ 333/26 |
| 7,626,472 | B2 * | 12/2009 | Davies-Venn et al. ........... 333/26 |
| 7,825,746 | B2 * | 11/2010 | Yeung et al. .................... 333/185 |
| 2011/0140806 | A1 | 6/2011 | Taniguchi |
| 2011/0169586 | A1 | 7/2011 | Taniguchi |
| 2012/0098622 | A1 | 4/2012 | Taniguchi |
| 2012/0098623 | A1 | 4/2012 | Taniguchi |

FOREIGN PATENT DOCUMENTS

| JP | 2005-045447 A | 2/2005 |
| JP | 2011-124880 A | 6/2011 |
| JP | 2012-109949 A | 6/2012 |
| JP | 2012-109950 A | 6/2012 |
| WO | 2010/055725 A1 | 5/2010 |

* cited by examiner

*Primary Examiner* — Dinh Le
(74) *Attorney, Agent, or Firm* — Keating & Bennett, LLP

(57) ABSTRACT

A balance filter includes an unbalanced terminal, a first balanced terminal, a second balanced terminal, a ground terminal, an unbalanced-side coupling coil, a balanced-side coupling coil electromagnetically coupled to the unbalanced-side coupling coil, and an unbalanced-side capacitor. The unbalanced-side capacitor, the unbalanced-side coupling coil, and a portion of the balanced-side coupling coil define an LC parallel resonant circuit. A first end of the balanced-side coupling coil is a terminal having the same polarity as that of a first end of the unbalanced-side coupling coil. A second end of the unbalanced-side coupling coil is connected to the first end of the balanced-side coupling coil.

20 Claims, 14 Drawing Sheets

BALANCE FILTER

BACKGROUND OF THE INVENTION

1. Field of the Invention

The present invention relates to a balance filter that includes an unbalanced-side coupling coil and a balanced-side coupling coil and that performs balance-unbalance conversion.

2. Description of the Related Art

For example, Japanese Unexamined Patent Application Publication No. 2011-124880 discloses a laminated balance filter that includes a laminate of a plurality of dielectric layers and electrode layers.

FIG. 13 is an exploded perspective view of the laminated balance filter disclosed in Japanese Unexamined Patent Application Publication No. 2011-124880. FIG. 14 is an equivalent circuit diagram of the laminated balance filter. As shown in FIG. 13, the laminated balance filter is composed of a laminate in which a plurality of dielectric layers 251, 242, 241, 271, 211, 201, and 221 in each of which a predetermined electrode pattern is formed are laminated.

As shown in FIG. 14, the laminated balance filter includes an unbalanced terminal Pu, a ground terminal Pg, and balanced terminals Pb1 and Pb2. A coil Lu in FIG. 14 corresponds to an unbalanced-side coil composed of via electrodes 151 and 152 and an unbalanced-side coil 131 shown in FIG. 13. A coil Lb in FIG. 14 corresponds to a coil 142 in the middle among three balanced-side coils shown in FIG. 13. A coil L1 corresponds to a coil composed of a balanced-side coil 141 and a via electrode 153 shown in FIG. 13. Similarly, a coil L2 corresponds to a coil composed of a balanced-side coil 143 and a via electrode 154 shown in FIG. 13.

In addition, a capacitor Cu in FIG. 14 is a capacitance generated between a capacitor electrode 121 and a ground electrode 120. A capacitor C1 is a capacitance generated between a capacitor electrode 122 and the ground electrode 120. Similarly, a capacitor C2 is a capacitance generated between a capacitor electrode 123 and the ground electrode 120.

The coil Lu and the capacitor Cu shown in FIG. 14 define an LC parallel resonator. A circuit composed of the coils L1 and L2 and the capacitors C1 and C2 serves as a circuit for impedance matching and impedance conversion.

The balance filter disclosed in Japanese Unexamined Patent Application Publication No. 2011-124880 allows the output impedance to be easily adjusted by the coils L1 and L2 and the capacitors C1 and C2 which are connected to the respective balance output terminals. In addition, the balance filter does not use a line of a ½ wave length and thus has an advantage that it is possible to reduce the element size.

In general, balance filters including one in Japanese Unexamined Patent Application Publication No. 2011-124880, an unbalanced-side coupling coil and a balanced-side coupling coil are electromagnetically coupled to each other, whereby signal conversion is performed between the unbalanced side and the balanced side and the degree of coupling between the coupling coils is mainly determined by the distance between the coupling coils. Therefore, when it is impossible to reduce the distance between the coupling coils due to manufacturing limitations or when the distance between the coupling coils is increased due to manufacturing variation, the degree of coupling between the coupling coils is decreased and the insertion loss of the balance filter is increased. In addition, it is effective to increase the winding diameter in order to increase the degree of coupling between the coupling coils. However, for that, the size has to be inevitably increased.

SUMMARY OF THE INVENTION

Preferred embodiments of the present invention provide a balance filter that allows the degree of coupling between a balanced side and an unbalanced side to be increased to reduce its insertion loss.

According to a preferred embodiment of the present invention, a balance filter includes: an unbalanced terminal; a first balanced terminal; a second balanced terminal; a ground terminal; an unbalanced-side coupling coil; a balanced-side coupling coil electromagnetically coupled to the unbalanced-side coupling coil; and an unbalanced-side capacitor. A first end of the unbalanced-side coupling coil is connected to the unbalanced terminal. A second end of the unbalanced-side coupling coil is connected to the ground terminal. A first end of the unbalanced-side capacitor is connected to the unbalanced terminal and a second end of the unbalanced-side capacitor is connected to the ground terminal to define an LC parallel resonant circuit including the unbalanced-side capacitor, the unbalanced-side coupling coil, and the balanced-side coupling coil. A first end of the balanced-side coupling coil which is a terminal having the same polarity as that of the first end of the unbalanced-side coupling coil is connected to the first balanced terminal. A second end of the balanced-side coupling coil is connected to the second balanced terminal. The second end of the unbalanced-side coupling coil is connected to the balanced-side coupling coil.

With the above configuration, inductive coupling between the balanced-side coupling coil and the unbalanced-side coupling coil is made strong, and thus insertion loss is reduced.

In accordance with a preferred embodiment of the present invention, the second end of the unbalanced-side coupling coil is preferably connected to the first end of the balanced-side coupling coil or a position on a side of the first end of the balanced-side coupling coil with respect to a center of the balanced-side coupling coil.

According to a preferred embodiment of the present invention, a balance filter includes: an unbalanced terminal; a first balanced terminal; a second balanced terminal; a ground terminal; an unbalanced-side coupling coil; a balanced-side coupling coil electromagnetically coupled to the unbalanced-side coupling coil; and an unbalanced-side capacitor. A first end of the unbalanced-side coupling coil is connected to the unbalanced terminal. A second end of the unbalanced-side coupling coil is connected to the ground terminal. A first end of the unbalanced-side capacitor is connected to the unbalanced terminal and a second end of the unbalanced-side capacitor is connected to the ground terminal to define an LC parallel resonant circuit including the unbalanced-side capacitor and the unbalanced-side coupling coil. A first end of the balanced-side coupling coil which is a terminal having the same polarity as that of the first end of the unbalanced-side coupling coil is connected to the first balanced terminal. A second end of the balanced-side coupling coil is connected to the second balanced terminal. The balanced-side coupling coil is connected at its middle to the ground terminal. The second end of the unbalanced-side coupling coil is connected to the first end of the balanced-side coupling coil or a position on a side of the first end of the balanced-side coupling coil with respect to a position at which the balanced-side coupling coil is connected to the ground terminal.

With the above configuration, the width difference and the phase difference of balanced output are easily adjusted.

In the above described preferred embodiments of the present invention, preferably, the balance filter further includes a first balanced-side coil, a second balanced-side coil, a first balanced-side capacitor, and a second balanced-side capacitor, a first end of the first balanced-side coil is connected to the first balanced terminal, a second end of the first balanced-side coil is connected to the first end of the balanced-side coupling coil, a first end of the second balanced-side coil is connected to the second balanced terminal, a second end of the second balanced-side coil is connected to the second end of the balanced-side coupling coil, a first end of the first balanced-side capacitor is connected to the first balanced terminal, a second end of the first balanced-side capacitor is connected to the ground terminal, a first end of the second balanced-side capacitor is connected to the second balanced terminal, and a second end of the second balanced-side capacitor is connected to the ground terminal.

With the above configuration, it is possible to set the output impedance of the balanced terminal to a predetermined value by the first and second balanced-side coils and the balanced-side capacitor.

In accordance with a preferred embodiment of the present invention, a capacitor arranged to remove direct current is preferably inserted between the first end of the unbalanced-side coupling coil and the unbalanced terminal. With the above configuration, it is made possible to add a DC feed.

According to a preferred embodiment of the present invention, a balance filter includes: a plurality of dielectric layers; a plurality of electrode layers; a plurality of vertical conduction electrodes extending in a lamination direction in which the dielectric layers are laminated; an unbalanced terminal; two balanced terminals; and a ground terminal. A ground electrode, an unbalanced-side coupling coil, a balanced-side coupling coil electromagnetically coupled to the unbalanced-side coupling coil, and an unbalanced-side capacitor electrode are defined by the electrode layers or by the electrode layers and the vertical conduction electrodes. The ground electrode is conducted to the ground terminal. A first end of the unbalanced-side coupling coil is conducted to the unbalanced terminal. The unbalanced-side capacitor electrode is located at a position facing the ground electrode and is conducted to the unbalanced terminal. A first end of the balanced-side coupling coil which is a terminal having the same polarity as that of the first end of the unbalanced-side coupling coil is conducted to a first balanced terminal. A second end of the balanced-side coupling coil is conducted to a second balanced terminal. A second end of the unbalanced-side coupling coil is conducted to the balanced-side coupling coil.

With the above configuration, inductive coupling between the balanced-side coupling coil and the unbalanced-side coupling coil is made strong, and thus insertion loss is reduced.

In the above described preferred embodiments of the present invention, the second end of the unbalanced-side coupling coil is preferably conducted to the first end of the balanced-side coupling coil or a position on a side of the first end of the balanced-side coupling coil with respect to a center of the balanced-side coupling coil.

According to a preferred embodiment of the present invention, a balance filter includes: a plurality of dielectric layers; a plurality of electrode layers; a plurality of vertical conduction electrodes extending in a lamination direction in which the dielectric layers are laminated; an unbalanced terminal; two balanced terminals; and a ground terminal. A ground electrode, an unbalanced-side coupling coil, a balanced-side coupling coil electromagnetically coupled to the unbalanced-side coupling coil, and an unbalanced-side capacitor electrode are defined by the electrode layers or by the electrode layers and the vertical conduction electrodes. The ground electrode is conducted to the ground terminal. A first end of the unbalanced-side coupling coil is conducted to the unbalanced terminal. The unbalanced-side capacitor electrode is located at a position facing the ground electrode and is conducted to the unbalanced terminal. A first end of the balanced-side coupling coil which is a terminal having the same polarity as that of the first end of the unbalanced-side coupling coil is conducted to a first balanced terminal. A second end of the balanced-side coupling coil is conducted to a second balanced terminal. The balanced-side coupling coil is connected at its middle to the ground terminal. A second end of the unbalanced-side coupling coil is conducted to the first end of the balanced-side coupling coil or a position on a side of the first end with respect to a position at which the balanced-side coupling coil is connected to the ground terminal.

With the above configuration, the width difference and the phase difference of balanced output are easily adjusted.

In the above preferred embodiments of the present invention, preferably, the unbalanced-side coupling coil includes a first unbalanced-side coupling coil conductor portion and a second unbalanced-side coupling coil conductor portion defined by the electrode layers and the vertical conduction electrodes, the first unbalanced-side coupling coil conductor portion and the second unbalanced-side coupling coil conductor portion are arranged on different dielectric layers, and the balanced-side coupling coil is arranged between the first unbalanced-side coupling coil conductor portion and the second unbalanced-side coupling coil conductor portion in the lamination direction.

Since the unbalanced-side coupling coil is defined by the two coil conductor portions arranged on the different dielectric layers as described above, it is possible to easily adjust the line width and the length of each coil portion, and desired characteristics are easily realized while the size is kept small.

In any one of the above described preferred embodiments, preferably, a first balanced-side coil and a second balanced-side coil are arranged by the electrode layers or by the electrode layers and the vertical conduction electrodes; a first balanced-side capacitor electrode and a second balanced-side capacitor electrode are arranged by the electrode layers; and by an electrode layer different from the electrode layers by which the balanced-side coupling coil and the unbalanced-side coupling coil are arranged, the ground electrode is located at positions sandwiching the first balanced-side capacitor electrode and the second balanced-side capacitor electrode.

With the above configurations of the preferred embodiments of the present invention, it is possible to reduce interference between the capacitor electrode and the coil.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
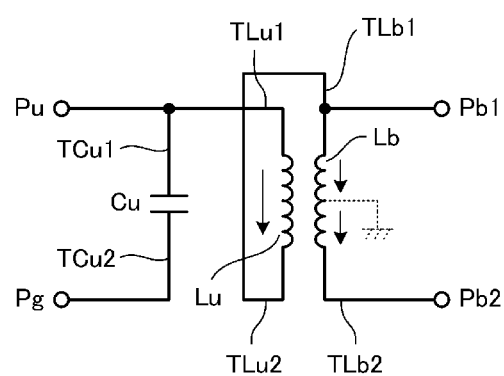
FIG. 1 is a circuit diagram of a balance filter according to a first preferred embodiment of the present invention.

FIG. 1 is a circuit diagram of a balance filter 101A according to a first preferred embodiment of the present invention. The balance filter 101A preferably includes an unbalanced terminal Pu, a first balanced terminal Pb1, a second balanced terminal Pb2, a ground terminal Pg, an unbalanced-side coupling coil Lu, a balanced-side coupling coil Lb electromagnetically coupled to the unbalanced-side coupling coil Lu, and an unbalanced-side capacitor Cu.

A first end $TLu1$ of the unbalanced-side coupling coil Lu is preferably connected to the unbalanced terminal Pu, and a second end $TLu2$ of the unbalanced-side coupling coil Lu is preferably connected to a first end $TLb1$ of the balanced-side coupling coil Lb. A first end $TCu1$ of the unbalanced-side capacitor Cu is preferably connected to the unbalanced terminal Pu, and a second end $TCu2$ of the unbalanced-side capacitor Cu is preferably connected to the ground terminal Pg. The unbalanced-side capacitor Cu, the unbalanced-side coupling coil Lu, and a portion of the balanced-side coupling coil Lb define an LC parallel resonant circuit.

The first end $TLb1$ of the balanced-side coupling coil Lb which is a terminal having the same polarity as that of the first end $TLu1$ of the unbalanced-side coupling coil Lu is preferably connected to the first balanced terminal Pb1, and a second end $TLb2$ of the balanced-side coupling coil Lb is preferably connected to the second balanced terminal Pb2.

The second end $TLu2$ of the unbalanced-side coupling coil Lu is preferably connected to the first end $TLb1$ of the balanced-side coupling coil Lb.

Due to the above configuration, as shown in the example of a preferred embodiment of FIG. 1, when a current flows in the unbalanced-side coupling coil Lu in a direction from the first end $TLu1$ of the unbalanced-side coupling coil Lu toward the second end $TLu2$ of the unbalanced-side coupling coil Lu, a current is induced in the balanced-side coupling coil Lb in a direction from the first end $TLb1$ of the balanced-side coupling coil Lb toward the second end $TLb2$ of the balanced-side coupling coil Lb. The direction of the current is the same (i.e., the current has the same polarity) as that of a current flowing from the second end $TLu2$ of the unbalanced-side coupling coil Lu toward the first end $TLb1$ of the balanced-side coupling coil Lb. Thus, inductive coupling between the balanced-side coupling coil Lb and the unbalanced-side coupling coil Lu becomes strong. As a result, insertion loss between the unbalanced terminal Pu and a balanced terminal (Pb1, Pb2) is reduced.

Figure 2:
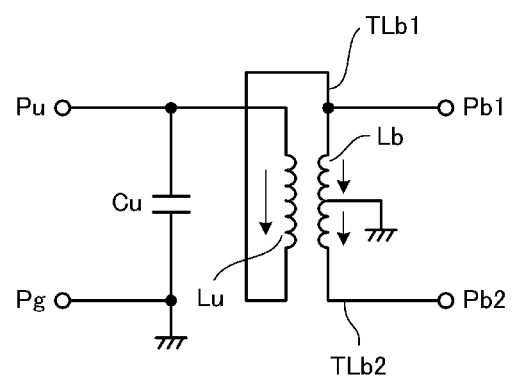
FIG. 2 is a circuit diagram of another balance filter according to the first preferred embodiment of the present invention.

FIG. 2 is a circuit diagram of another balance filter 101B according to the first preferred embodiment of the present invention. Unlike the balance filter 101A shown in FIG. 1, the balanced-side coupling coil Lb is preferably grounded at its middle. As shown in the example of the preferred embodiment of FIG. 2, when a current flows in the unbalanced-side coupling coil Lu in a direction from the first end $TLu1$ of the unbalanced-side coupling coil Lu toward the second end $TLu2$ of the unbalanced-side coupling coil Lu, a current is induced in the balanced-side coupling coil Lb in a direction from the first end $TLb1$ of the balanced-side coupling coil Lb toward the second end $TLb2$ of the balanced-side coupling coil Lb. The direction of the current is the same (i.e., the current has the same polarity) as that of a current flowing from the second end $TLu2$ of the unbalanced-side coupling coil Lu toward the first end $TLb1$ of the balanced-side coupling coil Lb. A current flowing in from the unbalanced terminal Pu passes through the unbalanced-side coupling coil Lu, enters the balanced-side coupling coil Lb through the first end $TLb1$, and flows through a portion of the balanced-side coupling coil Lb (a portion between the ground and the first end $TLb1$) to the ground.

In the balance filter 101A shown in FIG. 1, when the balanced-side coupling coil Lb is coupled to the unbalanced-side coupling coil Lu, the center of the balanced-side coupling coil Lb serves as an imaginary ground because both ends of the balanced-side coupling coil Lb are taken out as the balanced terminals Pb1 and Pb2. Thus, the balance filter 101A shown in FIG. 1 and the balance filter 101B shown in FIG. 2 operate equivalently.

It should be noted that in FIG. 2, where the degree of coupling between the upper half of the balanced-side coupling coil Lb (a portion between the ground connection point and the first end $TLb1$ of the balanced-side coupling coil Lb) and the unbalanced-side coupling coil Lu is represented by M1 and the degree of coupling between the lower half of the balanced-side coupling coil Lb (a portion between the ground connection point and the second end $TLb2$ of the balanced-side coupling coil Lb) and the unbalanced-side coupling coil Lu is represented by M2, the relationship of M1>M2 is established. This is because the current flowing in the unbalanced-side coupling coil Lu also flows in the upper half of the balanced-side coupling coil Lb. Thus, the line lengths of the upper half and the lower half of the balanced-side coupling coil Lb, the distance of the balanced-side coupling coil Lb extending along the unbalanced-side coupling coil Lu, and the interval between the balanced-side coupling coil Lb and the unbalanced-side coupling coil Lu are determined as appropriate such that the widths and the phases of balanced signals outputted to the balanced terminals Pb1 and Pb2 are balanced.

Figure 3:
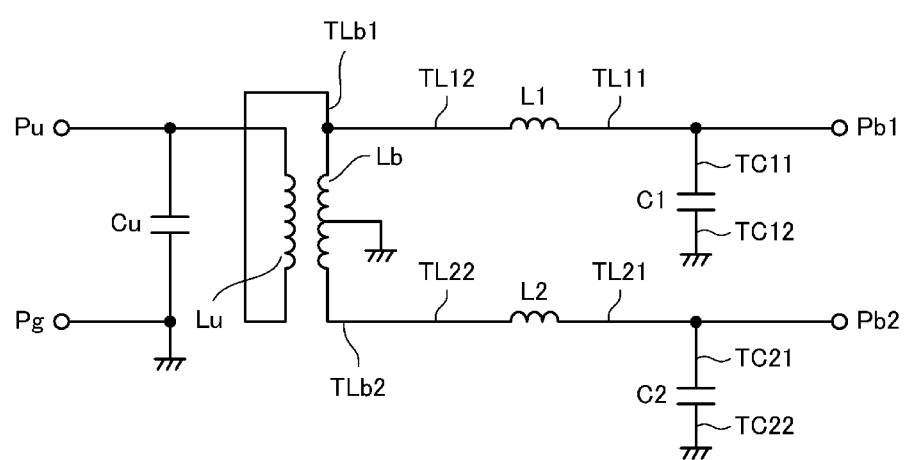
FIG. 3 is a circuit diagram of still another balance filter according to the first preferred embodiment of the present invention.

FIG. 3 is a circuit diagram of still another balance filter 101C according to the first preferred embodiment of the present invention. The balance filter 101C preferably includes a first balanced-side coil L1, a second balanced-side coil L2, a first balanced-side capacitor C1, and a second balanced-side capacitor C2. A first end TL11 of the first balanced-side coil L1 is preferably connected to the first balanced terminal Pb1, and a second end TL12 of the first balanced-side coil L1 is preferably connected to the first end TLb1 of the balanced-side coupling coil Lb. In addition, a first end TL21 of the second balanced-side coil L2 is preferably connected to the second balanced terminal Pb2, and a second end TL22 of the second balanced-side coil L2 is preferably connected to the second end TLb2 of the balanced-side coupling coil Lb.

Furthermore, a first end TC11 of the first balanced-side capacitor C1 is preferably connected to the first balanced terminal Pb1, and a second end TC12 of the first balanced-side capacitor C1 is grounded. A first end TC21 of the second balanced-side capacitor C2 is connected to the second balanced terminal Pb2, and a second end TC22 of the second balanced-side capacitor C2 is grounded.

Figure 4:
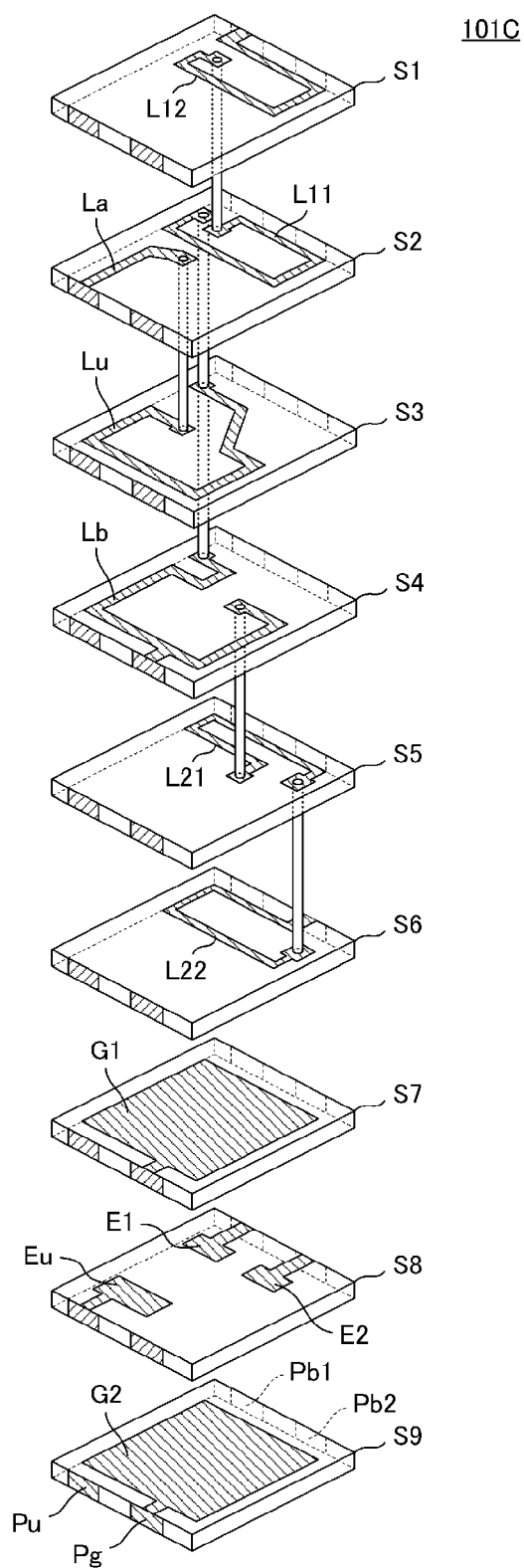
FIG. 4 is an exploded perspective view of the balance filter according to the first preferred embodiment of the present invention in a case where the balance filter is configured as a laminate.

FIG. 4 is an exploded perspective view of the balance filter 101C according to the first preferred embodiment of the present invention in a case where the balance filter 101C is provided as a laminate. The balance filter is defined by a laminate in which a plurality of dielectric layers S1 to S9 in each of which a predetermined electrode pattern is arranged are laminated. In a case where the laminate is formed by, for example, firing, a plurality of dielectric green sheets in each of which an electrode pattern is arranged are laminated, pressed, and fired. Thus, after the firing, the dielectric materials are integrated and do not necessarily form discrete layers. However, in this case as well, since the dielectric material having a predetermined thickness is present between each electrode layer, the laminate can be said to be one in which dielectric layers and electrode layers are laminated.

The laminate preferably includes one unbalanced terminal Pu, two balanced terminals Pb1 and Pb2, and a ground terminal Pg, and a plurality of vertical conduction electrodes (via electrodes) are arranged so as to extend in a direction in which the dielectric layers are laminated. Ground electrodes G1 and G2, an unbalanced-side coupling coil Lu, and a balanced-side coupling coil Lb electromagnetically coupled to the unbalanced-side coupling coil Lu, and an unbalanced-side capacitor electrode Eu are defined by the electrode layers or by the electrode layers and the vertical conduction electrodes. In addition, the ground electrodes G1 and G2 are conducted to the ground terminal Pg.

The unbalanced-side capacitor electrode Eu is preferably located at a position facing the ground electrodes G1 and G2 and is conducted to the unbalanced terminal Pu.

First balanced-side coil conductors L11 and L12 define a first balanced-side coil. An end portion of the first balanced-side coil conductor L12 (a first end of the first balanced-side coil) is conducted to the first balanced terminal Pb1. Another end portion of the first balanced-side coil conductor L12 (a second end of the first balanced-side coil) is conducted to a first end of the balanced-side coupling coil Lb.

Second balanced-side coil conductors L21 and L22 define a second balanced-side coil. An end portion of the second balanced-side coil conductor L22 (a first end of the second balanced-side coil) is conducted to the second balanced terminal Pb2. Another end portion of the second balanced-side coil conductor L22 (a second end of the second balanced-side coil) is conducted to a second end of the balanced-side coupling coil Lb.

A first end of the unbalanced-side coupling coil Lu is conducted to the unbalanced terminal Pu via a wiring conductor La. A second end of the unbalanced-side coupling coil Lu is conducted to the first end of the balanced-side coupling coil Lb.

As shown in FIG. 4, when the ground electrode G1 is located between the electrode layers on which the balanced-side coupling coil Lb and the unbalanced-side coupling coil Lu are arranged and the electrode layer on which the unbalanced-side capacitor electrode Eu, a first balanced-side capacitor electrode E1, and a second balanced-side capacitor electrode E2 are arranged, it is possible to reduce interference between each coil and the unbalanced-side capacitor electrode Eu and the balanced-side capacitor electrodes E1 and E2.

Figure 5:
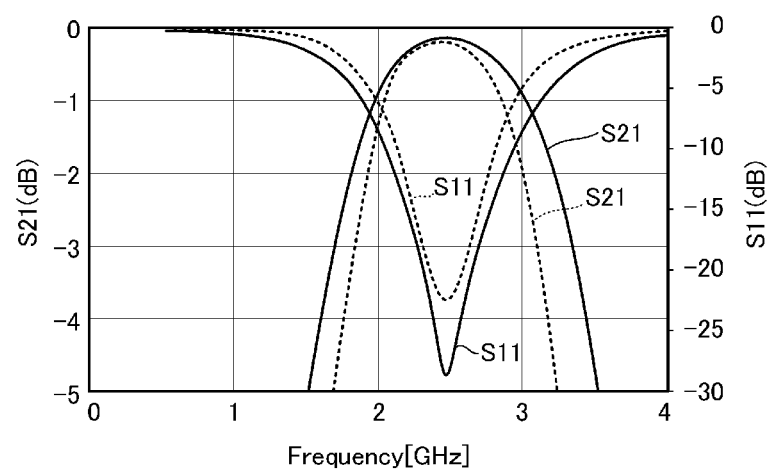
FIG. 5 is a diagram showing reflection characteristics and transmission characteristics by a circuit simulation, wherein solid lines indicate characteristics of a balance filter according to a preferred embodiment of the present invention and dashed lines indicate characteristics of an existing balance filter shown in FIG. 13.
Figure 13:
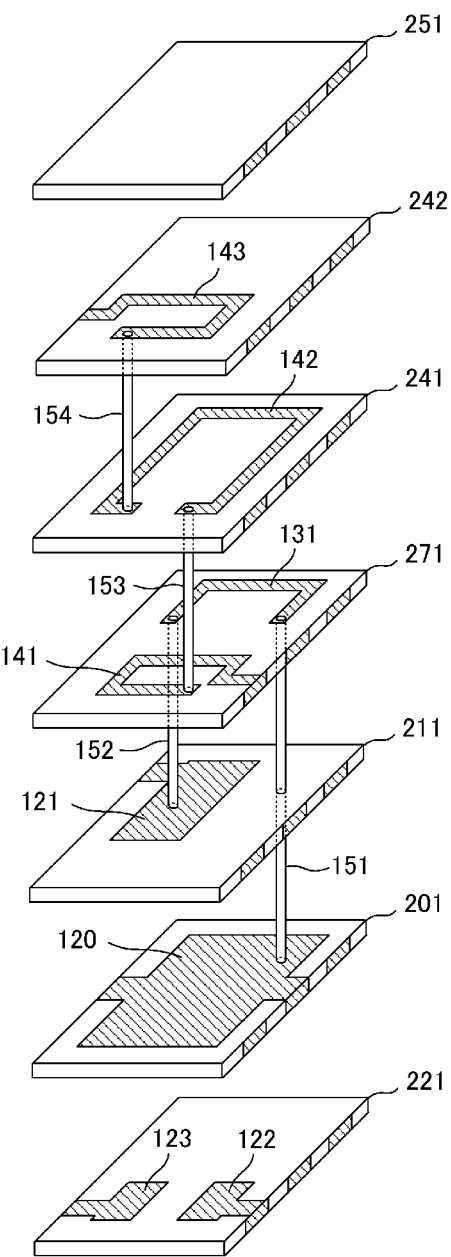
FIG. 13 is an exploded perspective view of a laminated balance filter in Japanese Unexamined Patent Application Publication No. 2011-124880.
Figure 14:
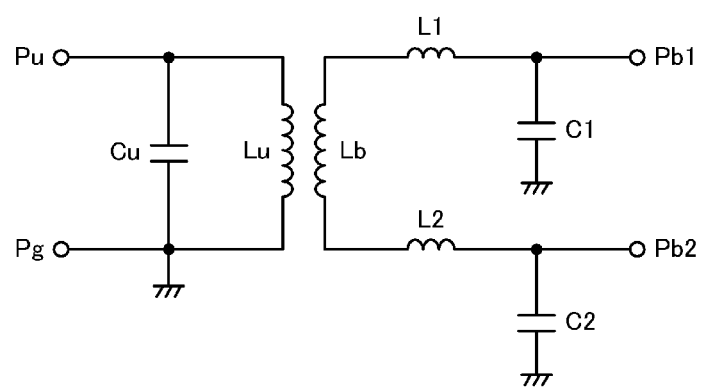
FIG. 14 is an equivalent circuit diagram of the laminated balance filter in Japanese Unexamined Patent Application Publication No. 2011-124880.

FIG. 5 is a diagram showing reflection characteristics and transmission characteristics by circuit simulation, wherein solid lines indicate characteristics of the balance filter 101C according to a preferred embodiment of the present invention and dashed lines indicate characteristics of an existing balance filter shown in FIG. 13. S21 is an insertion loss from the unbalanced terminal to the balanced terminal, and S11 is a reflection coefficient at the unbalanced terminal.

In the case of the existing balance filter, the insertion loss at 2.4 GHz that is a frequency in a pass band (a pass band that is set in the simulation) is 0.26 (dB), and the insertion loss at 2.5 GHz is 0.30 (dB). In the balance filter according to a preferred embodiment of the present invention, the insertion loss at 2.4 GHz that is the frequency in the pass band preferably is about 0.17 (dB), and the insertion loss at 2.5 GHz preferably is about 0.18 (dB), for example.

Figure 6A:
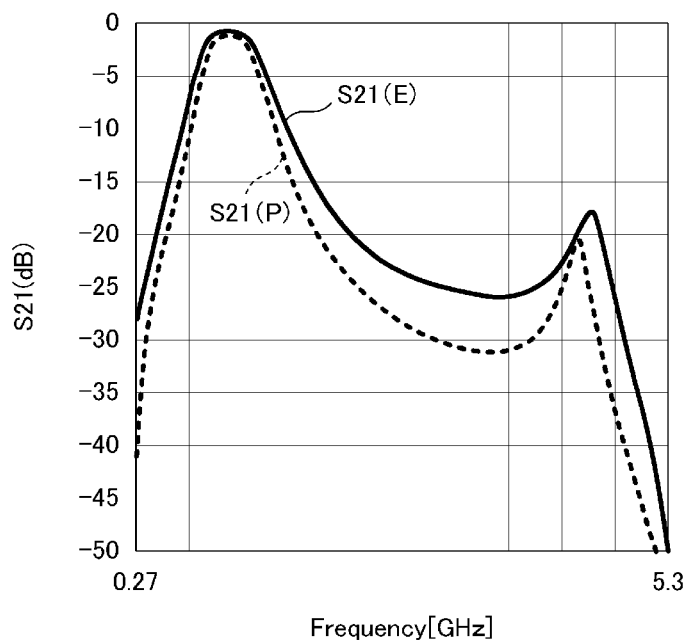
FIG. 6A is a diagram showing transmission characteristics by actual measurement, specifically, insertion loss in a frequency range of about 0.27 GHz to about 5.3 GHz.
Figure 6B:
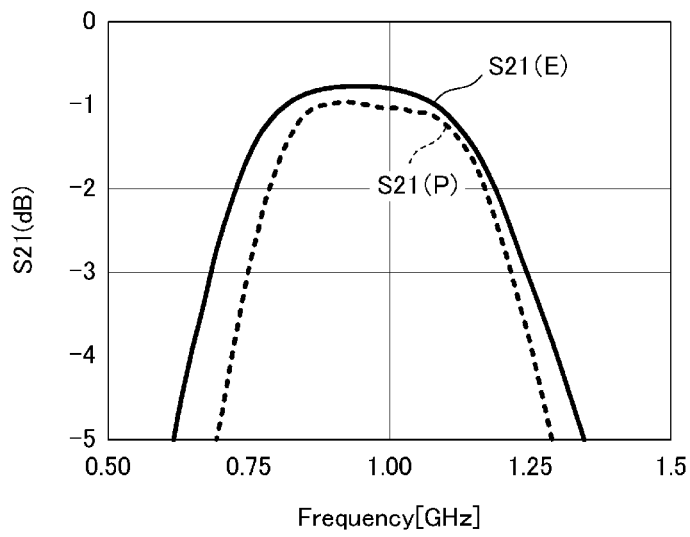
FIG. 6B is a diagram showing transmission characteristics by actual measurement, specifically, insertion loss in a frequency range of about 0.5 GHz to about 1.5 GHz.

FIG. 6A is a diagram showing transmission characteristics by actual measurement, specifically, insertion loss in a frequency range of about 0.27 GHz to about 5.3 GHz, and FIG. 6B is a diagram showing transmission characteristics by actual measurement, specifically, insertion loss in a frequency range of about 0.5 GHz to about 1.5 GHz. S21(P) is characteristics of the existing balance filter shown in FIG. 13, and S21(E) is characteristics of the balance filter 101C according to a preferred embodiment of the present invention.

In the case of the existing balance filter, the insertion loss at about 0.896 GHz that is a frequency in a pass band (the pass band of a produced trial balance filter) is about 1.02 (dB), and the insertion loss at about 0.96 GHz is about 1.00 (dB). In the balance filter according to a preferred embodiment of the present invention, the insertion loss at about 0.869 GHz that is the frequency in the pass band preferably is about 0.83 (dB), and the insertion loss at 0.96 GHz preferably is about 0.79 (dB), for example.

As described, in the simulation as well as in the actual measurement, it is recognized that the insertion loss is improved by about 0.2 dB, for example.

Second Preferred Embodiment

Figure 7:
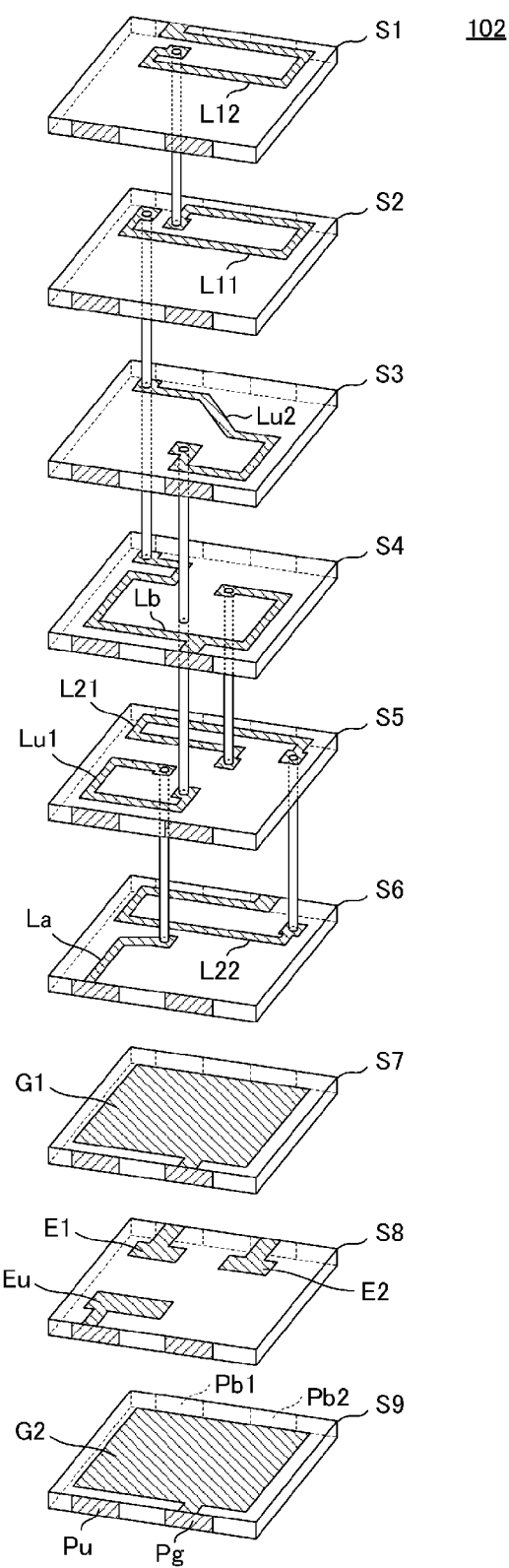
FIG. 7 is an exploded perspective view of a balance filter according to a second preferred embodiment of the present invention in the case where the balance filter is configured as a laminate.

FIG. 7 is an exploded perspective view of a balance filter 102 according to a second preferred embodiment of the present invention in a case where the balance filter 102 is provided as a laminate. The equivalent circuit of the balance filter 102 is the same as that shown in FIG. 3 in the first preferred embodiment. The balance filter 102 is provided by a laminate in which a plurality of dielectric layers S1 to S9 in each of which a predetermined electrode pattern is arranged are laminated.

The laminate preferably includes one unbalanced terminal Pu, two balanced terminals Pb1 and Pb2, and a ground terminal Pg, and a plurality of vertical conduction electrodes (via electrodes) are arranged so as to extend in a direction in which the dielectric layers are laminated. A balanced-side coupling coil Lb electromagnetically coupled to the unbalanced-side coupling coil, and an unbalanced-side capacitor electrode Eu are arranged by the electrode layers or by the electrode layers and the vertical conduction electrodes, ground electrodes G1 and G2, unbalanced-side coupling coil conductors Lu1 and Lu2 defining an unbalanced-side coupling coil. In addition, the ground electrodes G1 and G2 are conducted to the ground terminal Pg. A first end of the unbalanced-side coupling coil Lu is conducted to the unbalanced terminal Pu via a wiring conductor La.

The unbalanced-side capacitor electrode Eu is located at a position facing the ground electrodes G1 and G2 and is conducted to the unbalanced terminal Pu.

First balanced-side coil conductors L11 and L12 define a first balanced-side coil. An end portion of the first balanced-side coil conductor L12 (a first end of the first balanced-side coil) is conducted to the first balanced terminal Pb1. An end portion of the first balanced-side coil conductor L11 (a second end of the first balanced-side coil) is conducted to a first end of the balanced-side coupling coil Lb.

Second balanced-side coil conductors L21 and L22 define a second balanced-side coil. An end portion of the second balanced-side coil conductor L22 (a first end of the second balanced-side coil) is conducted to the second balanced terminal Pb2. An end portion of the second balanced-side coil conductor L21 (a second end of the second balanced-side coil) is conducted to a second end of the balanced-side coupling coil Lb.

As described above, the unbalanced-side coupling coil conductors Lu1 and Lu2 define the unbalanced-side coupling coil. An end portion of the unbalanced-side coupling coil conductor Lu1 (a first end of the unbalanced-side coupling coil) is preferably conducted to the unbalanced terminal Pu via the wiring conductor La. An end portion of the unbalanced-side coupling coil conductor Lu2 (a second end of the unbalanced-side coupling coil) is conducted to the first end of the balanced-side coupling coil Lb.

As described above, the coil conductor portions Lu1 and Lu2 defining the unbalanced-side coupling coil may be separately provided on two layers and located so as to sandwich the balanced-side coupling coil Lb. When the unbalanced-side coupling coil is defined by two coil conductor portions arranged on different dielectric layers, it is possible to easily adjust the line width and the length of each coil portion, and desired characteristics are easily realized while the size is kept small.

Third Preferred Embodiment

Figure 8:
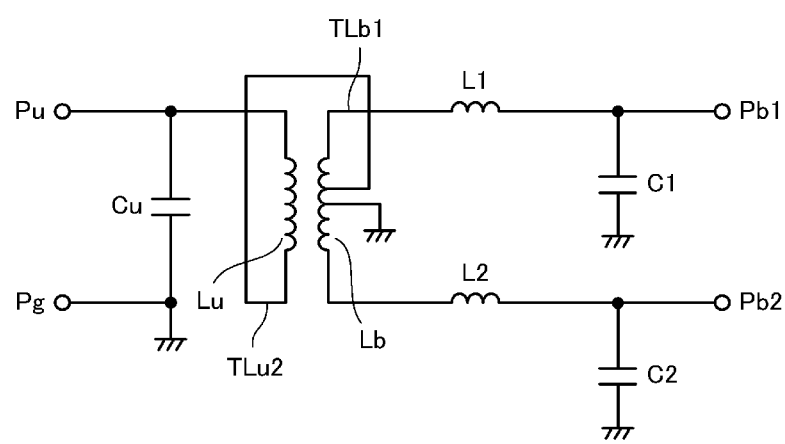
FIG. 8 is an equivalent circuit diagram of a balance filter according to a third preferred embodiment of the present invention.

FIG. 8 is an equivalent circuit diagram of a balance filter 103 according to a third preferred embodiment of the present invention. In this example, the second end TLu2 of the unbalanced-side coupling coil Lu is connected to a position closer to the center (the ground connection point) than the first end TLb1 of the balanced-side coupling coil Lb.

Figure 9:
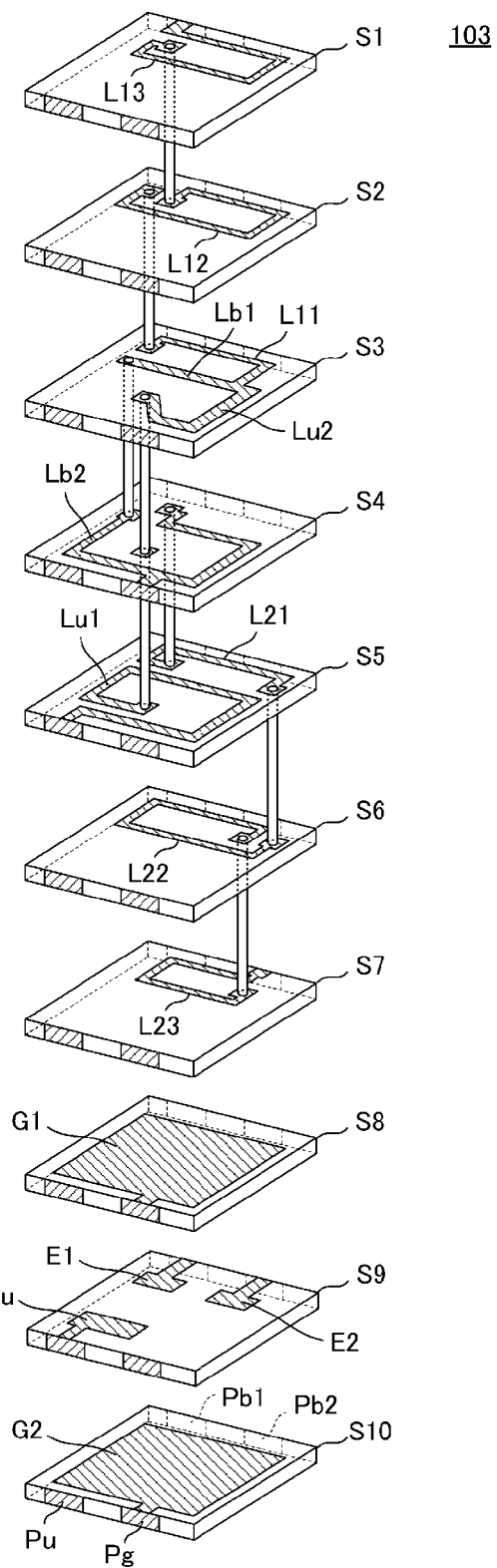
FIG. 9 is an exploded perspective view of the balance filter in the case where the balance filter is configured as a laminate.

FIG. 9 is an exploded perspective view of the balance filter 103 in the case where the balance filter 103 is provided as a laminate. The equivalent circuit of the balance filter 103 is the same as that shown in FIG. 3 in the first preferred embodiment. The balance filter 103 is preferably provided by a laminate in which a plurality of dielectric layers S1 to S10 in each of which a predetermined electrode pattern is arranged are laminated.

In this example, a portion L11 of a coil conductor defining a first balanced-side coil is arranged on the dielectric layer S3. In addition, a portion Lb1 of a coil conductor defining a balanced-side coupling coil is arranged on the dielectric layer S3, and a portion Lb2 of the coil conductor defining the balanced-side coupling coil is arranged on the dielectric layer S4. Furthermore, a portion Lu2 of a coil conductor defining an unbalanced-side coupling coil is arranged on the dielectric layer S3. The coil conductor Lb1 can also be regarded as a portion of the coil conductor L11 defining the first balanced-side coil.

The other basic configuration is preferably the same as that of the second preferred embodiment. As described above, the second end of the unbalanced-side coupling coil Lu is not limited to be connected to the first end of the balanced-side coupling coil Lb and may alternatively be connected to a position closer to the center of the coil than the first end of the balanced-side coupling coil Lb.

In the present preferred embodiment, the coil conductor Lu2 arranged on the dielectric layer S3 and defining a portion of the unbalanced-side coupling coil and a portion of a coil conductor Lu1 arranged on the dielectric layer S5 and defining a portion of the unbalanced-side coupling coil sandwich the balanced-side coupling coil Lb2 arranged on the dielectric layer S4, in the direction in which the dielectric layers are laminated. Thus, it is possible to strengthen capacitive coupling between the unbalanced-side coupling coil and the balanced-side coupling coil.

Fourth Preferred Embodiment

Figure 10A:
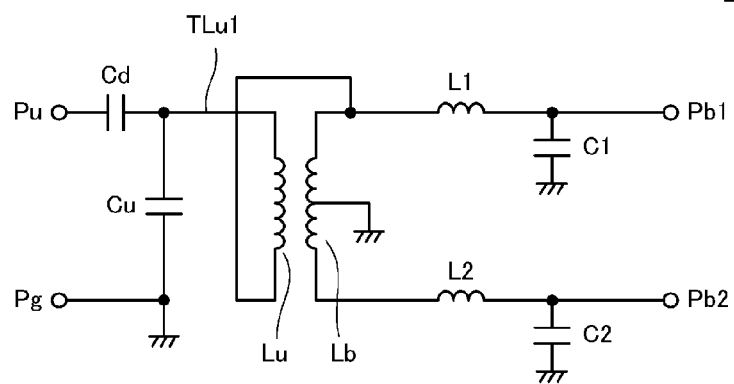
FIGS. 10A and 10B are equivalent circuit diagrams of balance filters according to a fourth preferred embodiment of the present invention.
Figure 10B:
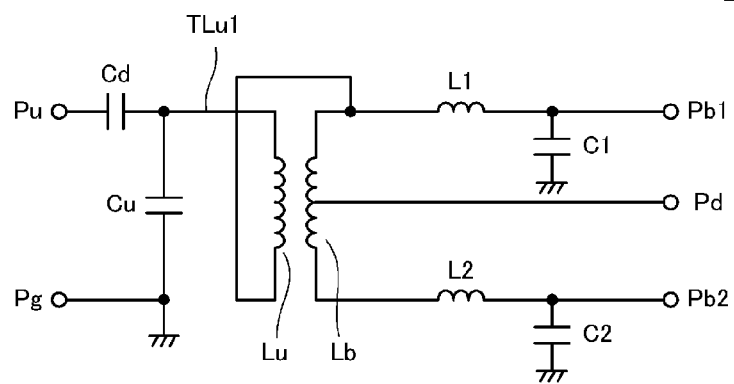

FIGS. 10A and 10B are equivalent circuit diagrams of balance filters 104A and 104B according to a fourth preferred embodiment of the present invention. In the balance filter 104A, unlike the balance filter 101C shown in FIG. 3, a capacitor Cd arranged to remove direct current is preferably inserted between the first end TLu1 of the unbalanced-side coupling coil Lu and the unbalanced terminal Pu. In addition, the balance filter 104B preferably includes a DC bias terminal Pd, and the center of the balanced-side coupling coil Lb is not connected to the ground terminal Pg and is connected to the DC bias terminal Pd.

Figure 11:
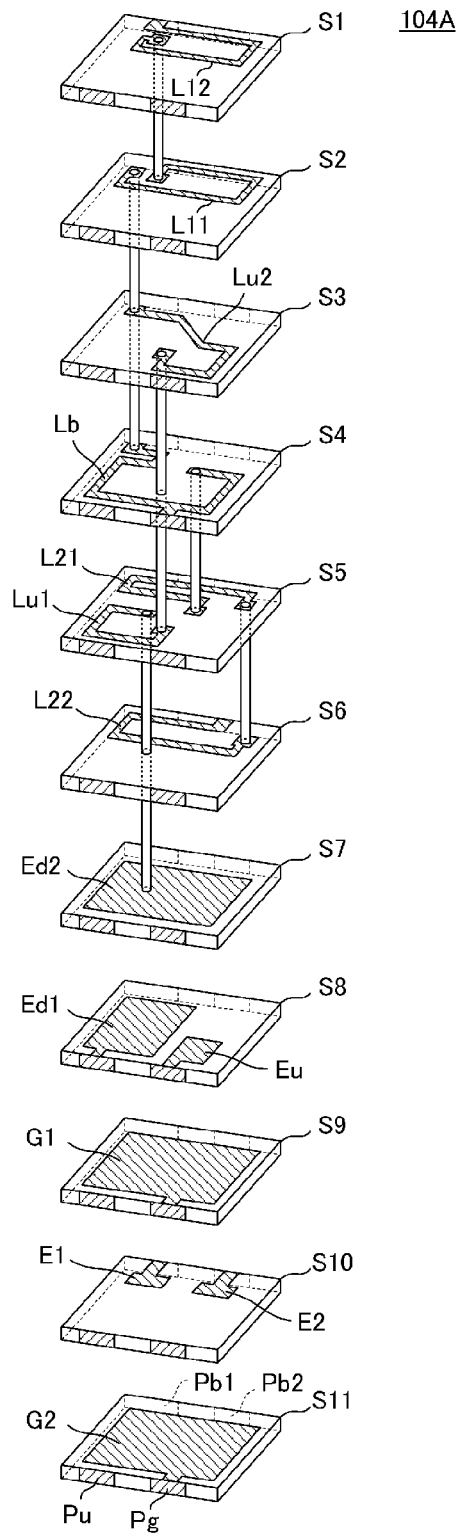
FIG. 11 is an exploded perspective view of the balance filter in the case where the balance filter is configured as a laminate.

FIG. 11 is an exploded perspective view of the balance filter 104A in the case where the balance filter 104A is provided as a laminate. The balance filter 104A is provided by a laminate in which a plurality of dielectric layers S1 to S11 in each of which a predetermined electrode pattern is arranged are laminated. An electrode Ed2 arranged on the dielectric layer S7 and an electrode Ed1 arranged on the dielectric layer S8 preferably define the capacitor Cd, arranged to remove direct current, shown in FIG. 10A. In addition, an electrode Eu arranged on the dielectric layer S8 and a ground electrode G1 arranged on the dielectric layer S9 preferably define an unbalanced-side capacitor Cu shown in FIG. 10A.

With the above configuration, the unbalanced terminal Pu and the balanced-side coupling coil Lb are in a galvanically-isolated state. Thus, it is possible to apply a direct current bias voltage from an external circuit to the circuit connected to the unbalanced terminal Pu, without the direct current bias voltage being influenced by the balanced-side circuit.

In addition, when the DC bias terminal Pd is provided as shown in FIG. 10B, it is also possible to apply a direct current bias voltage to the balanced-side circuit connected to the balanced terminals Pb1 and Pb2, without the direct current bias voltage being influenced by the circuit connected to the unbalanced terminal.

Fifth Preferred Embodiment

Figure 12:
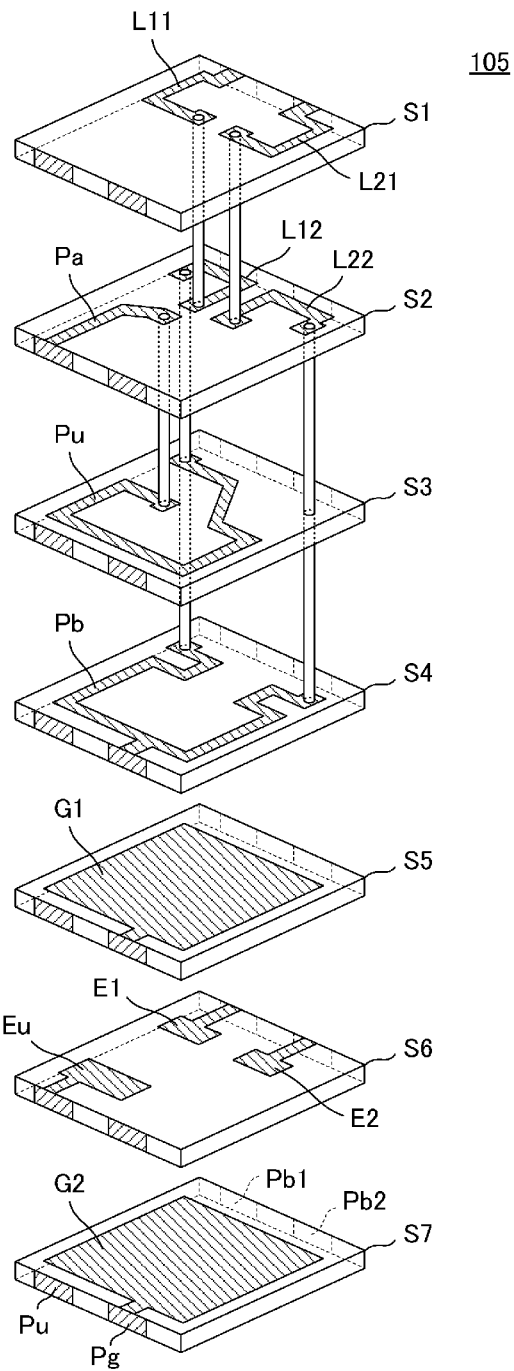
FIG. 12 is an exploded perspective view of a balance filter according to a fifth preferred embodiment of the present invention in the case where the balance filter is configured as a laminate.

FIG. 12 is an exploded perspective view of a balance filter 105 according to a fifth preferred embodiment of the present invention in a case where the balance filter 105 is provided by a laminate. The equivalent circuit of the balance filter 105 is preferably the same as that shown in FIG. 3 in the first preferred embodiment. The balance filter 105 is provided by a laminate in which a plurality of dielectric layers S1 to S7 in each of which a predetermined electrode pattern is arranged are laminated. Coil conductors L11 and L12 arranged on the dielectric layers S1 and S2 define a first balanced-side coil L1. Similarly, coil conductors L21 and L22 define a second balanced-side coil L2. The other basic configuration is the same as that shown in FIG. 4.

As described above, the balanced-side coils L1 and L2 may be arranged on the same dielectric layer. Thus, it is possible to reduce the number of the dielectric layers and the electrode layers and to decrease the height.

Other Preferred Embodiments

Although preferred embodiments of the present invention have been described above with the unbalanced terminal used as an input terminal and with the balanced terminal used as an output terminal, it is also possible to use the balanced terminal as an input terminal and the unbalanced terminal as an output terminal, if so desired.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balance filter comprising:
an unbalanced terminal;
a first balanced terminal;
a second balanced terminal;
a ground terminal;
an unbalanced-side coupling coil;
a balanced-side coupling coil electromagnetically coupled to the unbalanced-side coupling coil; and
an unbalanced-side capacitor; wherein
a first end of the unbalanced-side coupling coil is connected to the unbalanced terminal;
a second end of the unbalanced-side coupling coil is connected to the ground terminal;
a first end of the unbalanced-side capacitor is connected to the unbalanced terminal and a second end of the unbalanced-side capacitor is connected to the ground terminal, and an LC parallel resonant circuit is defined by the unbalanced-side capacitor and the unbalanced-side coupling coil;
a first end of the balanced-side coupling coil is connected to the first balanced terminal, and a polarity of the first end of the balanced-side coupling coil is the same as a polarity of the first end of the unbalanced side coupling coil;
a second end of the balanced-side coupling coil is connected to the second balanced terminal; and
the second end of the unbalanced-side coupling coil is directly physically and electrically connected to the balanced-side coupling coil.

2. The balance filter according to claim 1, wherein the second end of the unbalanced-side coupling coil is connected to the first end of the balanced-side coupling coil or a position on a side of the first end of the balanced-side coupling coil with respect to a center of the balanced-side coupling coil.

3. The balance filter according to claim 1, further comprising a first balanced-side coil, a second balanced-side coil, a first balanced-side capacitor, and a second balanced-side capacitor; wherein
a first end of the first balanced-side coil is connected to the first balanced terminal;
a second end of the first balanced-side coil is connected to the first end of the balanced-side coupling coil;
a first end of the second balanced-side coil is connected to the second balanced terminal;
a second end of the second balanced-side coil is connected to the second end of the balanced-side coupling coil;
a first end of the first balanced-side capacitor is connected to the first balanced terminal;
a second end of the first balanced-side capacitor is connected to the ground terminal;
a first end of the second balanced-side capacitor is connected to the second balanced terminal; and
a second end of the second balanced-side capacitor is connected to the ground terminal.

4. The balance filter according to claim 1, wherein another capacitor arranged to remove direct current is located between the first end of the unbalanced-side coupling coil and the unbalanced terminal.

5. The balance filter according to claim 1, wherein a DC bias terminal is connected to a center of the balanced-side coupling coil.

6. The balance filter according to claim 5, wherein the second end of the unbalanced-side coupling coil is connected to the first end of the balanced-side coupling coil.

7. The balance filter according to claim 5, wherein a capacitor arranged to remove direct current is inserted between the first end of the unbalanced-side coupling coil and the unbalanced terminal.

8. The balance filter according to claim 3, wherein the balanced-side coupling coil is connected at its middle to the ground terminal.

9. The balance filter according to claim 3, wherein a DC bias terminal is connected to a center of the balanced-side coupling coil.

10. The balance filter according to claim 5, further comprising a first balanced-side coil, a second balanced-side coil, a first balanced-side capacitor, and a second balanced-side capacitor; wherein
a first end of the first balanced-side coil is connected to the first balanced terminal;
a second end of the first balanced-side coil is connected to the first end of the balanced-side coupling coil;
a first end of the second balanced-side coil is connected to the second balanced terminal;
a second end of the second balanced-side coil is connected to the second end of the balanced-side coupling coil;
a first end of the first balanced-side capacitor is connected to the first balanced terminal;
a second end of the first balanced-side capacitor is connected to the ground terminal;
a first end of the second balanced-side capacitor is connected to the second balanced terminal; and
a second end of the second balanced-side capacitor is connected to the ground terminal.

11. The balance filter according to claim 10, wherein the second end of the unbalanced-side coupling coil is connected to the first end of the balanced-side coupling coil.

12. The balance filter according to claim 3, wherein the balanced-side coupling coil is connected at its middle to the ground terminal and a second end of the unbalanced-side coupling coil is conducted to a position on a side of the first end with respect to a position at which the balanced-side coupling coil is connected to the ground terminal.

13. The balance filter according to claim 9, wherein the second end of the unbalanced-side coupling coil is connected to the first end of the balanced-side coupling coil.

14. A balance filter comprising:
an unbalanced terminal;
a first balanced terminal;
a second balanced terminal;
a ground terminal;
an unbalanced-side coupling coil;
a balanced-side coupling coil electromagnetically coupled to the unbalanced-side coupling coil; and
an unbalanced-side capacitor; wherein
a first end of the unbalanced-side coupling coil is connected to the unbalanced terminal;
a second end of the unbalanced-side coupling coil is connected to the ground terminal;
a first end of the unbalanced-side capacitor is connected to the unbalanced terminal and a second end of the unbalanced-side capacitor is connected to the ground terminal, and an LC parallel resonant circuit is defined by the unbalanced-side capacitor and the unbalanced-side coupling coil;
a first end of the balanced-side coupling coil is connected to the first balanced terminal, and a polarity of the first end of the balanced-side coupling coil is the same as a polarity of the first end of the unbalanced side coupling coil;
a second end of the balanced-side coupling coil is connected to the second balanced terminal;
the balanced-side coupling coil is connected at its middle to the ground terminal; and
the second end of the unbalanced-side coupling coil is directly physically and electrically connected to the first end of the balanced-side coupling coil or a position on a side of the first end of the balanced-side coupling coil with respect to a position at which the balanced-side coupling coil is connected to the ground terminal.

15. A balance filter comprising:
a plurality of dielectric layers;
a plurality of electrode layers;
a plurality of vertical conduction electrodes extending in a lamination direction in which the dielectric layers are laminated;
an unbalanced terminal;
two balanced terminals; and
a ground terminal; wherein
a ground electrode, an unbalanced-side coupling coil, a balanced-side coupling coil electromagnetically coupled to the unbalanced-side coupling coil, and an unbalanced-side capacitor electrode are defined by the electrode layers or by the electrode layers and the vertical conduction electrodes;
the ground electrode is conducted to the ground terminal;
a first end of the unbalanced-side coupling coil is conducted to the unbalanced terminal;
the unbalanced-side capacitor electrode is located at a position facing the ground electrode and is conducted to the unbalanced terminal;
a first end of the balanced-side coupling coil is conducted to a first balanced terminal, and a polarity of the first end of the balanced-side coupling coil is the same as a polarity of the first end of the unbalanced side coupling coil;
a second end of the balanced-side coupling coil is conducted to a second balanced terminal; and
a second end of the unbalanced-side coupling coil is directly physically and electrically connected to the balanced-side coupling coil.

16. The balance filter according to claim 15, wherein the second end of the unbalanced-side coupling coil is conducted to the first end of the balanced-side coupling coil or a position on a side of the first end of the balanced-side coupling coil with respect to a center of the balanced-side coupling coil.

17. The balance filter according to claim 15, wherein the unbalanced-side coupling coil includes a first unbalanced-side coupling coil conductor portion and a second unbalanced-side coupling coil conductor portion arranged by the electrode layers and the vertical conduction electrodes;
the first unbalanced-side coupling coil conductor portion and the second unbalanced-side coupling coil conductor portion are arranged on different dielectric layers; and
the balanced-side coupling coil is arranged between the first unbalanced-side coupling coil conductor portion and the second unbalanced-side coupling coil conductor portion in the lamination direction.

18. The balance filter according to claim 15, wherein
a first balanced-side coil and a second balanced-side coil are defined by the electrode layers or by the electrode layers and the vertical conduction electrodes;
a first balanced-side capacitor electrode and a second balanced-side capacitor electrode are defined by the electrode layers; and
by an electrode layer different from the electrode layers by which the balanced-side coupling coil and the unbalanced-side coupling coil are arranged, the ground electrode is located at positions sandwiching the first balanced-side capacitor electrode and the second balanced-side capacitor electrode.

19. The balance filter according to claim 15, wherein the second end of the unbalanced-side coupling coil is conducted to a position on a side of the first end of the balanced-side coupling coil with respect to a center of the balanced-side coupling coil.

20. A balance filter comprising:
a plurality of dielectric layers;
a plurality of electrode layers;
a plurality of vertical conduction electrodes extending in a lamination direction in which the dielectric layers are laminated;
an unbalanced terminal;
two balanced terminals; and
a ground terminal; wherein
a ground electrode, an unbalanced-side coupling coil, a balanced-side coupling coil electromagnetically coupled to the unbalanced-side coupling coil, and an unbalanced-side capacitor electrode are defined by the electrode layers or by the electrode layers and the vertical conduction electrodes;
the ground electrode is conducted to the ground terminal;
a first end of the unbalanced-side coupling coil is conducted to the unbalanced terminal;
the unbalanced-side capacitor electrode is located at a position facing the ground electrode and is conducted to the unbalanced terminal;
a first end of the balanced-side coupling coil is conducted to a first balanced terminal, and a polarity of the first end of the balanced-side coupling coil is the same as a polarity of the first end of the unbalanced side coupling coil;
a second end of the balanced-side coupling coil is conducted to a second balanced terminal;
the balanced-side coupling coil is connected at its middle to the ground terminal; and
a second end of the unbalanced-side coupling coil is directly physically and electrically connected to the first end of the balanced-side coupling coil or a position on a side of the first end with respect to a position at which the balanced-side coupling coil is connected to the ground terminal.

* * * * *